United States Patent
Kim et al.

[11] Patent Number: 6,150,762
[45] Date of Patent: Nov. 21, 2000

[54] METHOD OF MANUFACTURING CATHODE FOR PLASMA ETCHING APPARATUS USING CHEMICAL SURFACE TREATMENT WITH POTASSIUM HYDROXIDE (KOH), AND CATHODE MANUFACTURED THEREBY

[75] Inventors: Jin-sung Kim; Young-gu Lee; Kyoung-man Shim, all of Kyungki-do; Kyue-sang Choi, Seoul, all of Rep. of Korea

[73] Assignee: Samsung Electronics Co., Ltd., Suwon, Rep. of Korea

[21] Appl. No.: 09/234,496

[22] Filed: Jan. 21, 1999

[30] Foreign Application Priority Data

Jan. 26, 1998 [KR] Rep. of Korea ............ 98-2382

[51] Int. Cl.[7] ............................................. H01J 7/24
[52] U.S. Cl. ............................... 315/111.21; 445/46
[58] Field of Search ................... 315/111.21; 445/73, 445/46, 47, 59; 427/532, 534, 541, 560, 569, 457; 313/346 DC; 204/157.15, 298.31

[56] References Cited

U.S. PATENT DOCUMENTS

| | | | |
|---|---|---|---|
| 3,967,150 | 6/1976 | Lien et al. | 313/348 |
| 4,745,326 | 5/1988 | Greene et al. | 445/46 |
| 4,871,580 | 10/1989 | Schram et al. | 427/38 |
| 4,874,484 | 10/1989 | Foell et al. | 204/129.3 |
| 5,395,481 | 3/1995 | McCarthy | 156/630 |

*Primary Examiner*—Don Wong
*Assistant Examiner*—Thuy Vinh Tran
*Attorney, Agent, or Firm*—Jones Volentine, LLC

[57] ABSTRACT

A method of manufacturing a cathode for a plasma etching apparatus includes steps for making the inside of holes formed in the cathode and the surface of the cathode a hard surface so as to prevent particle generation while the cathode is in use for etching a wafer. These steps include: a) forming a plurality of holes in a silicon substrate; b) carrying out a physical-surface treatment on the surface of the silicon substrate using slurry; and c) carrying out a chemical-surface treatment for removing protrusions inside the holes formed on the silicon substrate and on the surface of the silicon substrate using potassium hydroxide (KOH). The cathode manufactured by this method has a hard surface formed thereon and inside the holes, and the hard surface has no protrusions. Without protrusions, no particles can be generated from protrusions being etched and loosened during the etching process, so no particles adhere to the wafer being etched.

18 Claims, 5 Drawing Sheets

METHOD OF MANUFACTURING CATHODE FOR PLASMA ETCHING APPARATUS USING CHEMICAL SURFACE TREATMENT WITH POTASSIUM HYDROXIDE (KOH), AND CATHODE MANUFACTURED THEREBY

BACKGROUND OF THE INVENTION

1. Field of the Invention

The present invention relates to a method of manufacturing a cathode for a plasma etching apparatus, and a cathode manufactured thereby. More particularly, the present invention relates to a method of manufacturing a cathode which includes a chemical surface treatment of the silicon substrate from which the cathode is manufactured, in which the protrusions formed inside the holes and on the surface of the silicon substrate are removed using potassium hydroxide (KOH).

2. Background of the Related Art

In general, semiconductor devices are manufactured by forming layers on a semiconductor wafer, and forming a specific pattern on the layers according to the desired characteristics of the semiconductor devices. The specific pattern can be formed by completely or selectively removing certain layers on the wafer using an etching process.

The wet etching process, which was widely used to accomplish the layer removal, has been replaced by a dry etching process using plasma to produce highly-integrated semiconductor devices. Referring to FIG. 1, a conventional etching chamber for carrying out a dry etching process using plasma comprises a cathode 10 serving as an upper electrode to which a high frequency power is applied, and a chuck 14 (normally an electrostatic chuck) located beneath the cathode 10 for mounting a wafer 12. Beneath the chuck 14, there is provided an anode 16 serving as a lower electrode, and a power applier 18 for applying a high frequency power to the cathode 10 and the anode 16.

A plurality of holes for supplying gas into the etching chamber during the etching process are formed in the cathode 10, and a gas supplier 20 is provided for supplying the gas into the etching chamber. In addition, a baffle 22 is provided on top of the cathode 10, such that the gas is uniformly supplied to the entire surface of the wafer 12.

The etching chamber also includes: an RF matching box 24 for matching the condition of high frequency power applied to the etching chamber; a remote power module 26 for controlling process conditions related to the etching chamber; a temperature control unit 28 for controlling the temperature of the etching chamber; and a chuck power unit 32 for supplying power to a pump 30 and the chuck 14.

The cathode 10 of the etching apparatus can be made using aluminum, with a surface of anodized aluminum, quartz, ceramic, etc. Furthermore, to improve the uniformity of a layer to be etched during the etching process, the cathode 10 can be made of a silicon substrate, the same material as the wafer 12.

However, a cathode made of silicon substrate also serves as source of particles, just as cathodes made of aluminum, aluminum with an anodized surface, quartz, ceramic, etc., serve as sources of particles. The particles are generated from protrusions existing on the surface of the cathode 10 and inside the holes formed in the cathode 10. FIG. 2 shows the surface of the cathode 10 magnified 800 times using a microscope, and FIG. 3 shows the inside of the holes formed in the cathode 10 magnified 4,000 times using a scanning electron microscope.

These protrusions in the cathode 10 as shown in FIGS. 2 and 3 create particles, because the protrusions are etched off of the cathode 10 while a layer of the wafer 10 is being etched.

In other words, plasma formed inside the etching chamber reacts with the surface of the cathode 10 made of silicon substrate, such that the protrusions present on the surface of the cathode 10 are etched and separated as particles, and these particles attach to the wafer located beneath the cathode 10.

The plasma enters the holes in the cathode 10, and then reacts with the inside of the holes so that the protrusions inside the holes are also etched and separated, and then attach to the wafer.

The protrusions etched and separated from the inside and surface of the holes on the cathode 10 quickly adhere to the wafer due to the electrostatic force of the chuck 14 on which the wafer 12 is mounted.

While the etching process using the conventional cathode 10 made of silicon substrate is continuously carried out, the protrusions on the inside and on the surface of the holes in the cathode 10 are continuously etched and separated. Eventually, a slippery, hard surface is formed on the cathode 10 such that no further etching and separation is possible, as illustrated in FIG. 4 showing the inside of the holes formed on the cathode 10 magnified 800 times.

Then, the etching process can be carried out for a certain time with the inside and the surface of the holes of the cathode 10 formed as a hard surface.

However, even if particles are no longer generated from the hard surface of the cathode 10, the diameter of the holes has been enlarged by the etching and separation of the protrusions in the inlet of the holes, and the etching conditions have been changed. For example, the amount of gas supplied during the etching process is changed due to the enlargement of the hole diameter.

The changes in the etching conditions cause distortion of the critical dimension of the wafer pattern. Accordingly, after carrying out the etching process for a certain time, the cathode 10 must be replaced. That is, the enlargement of the holes during the etching process, and the replacement of the cathode 10, result in reduction of the useful life of the cathode.

Furthermore, the conventional cathode 10 is a source of particles which cause failure of the etching process, thereby deteriorating the reliability of the process.

SUMMARY OF THE INVENTION

The present invention provides a method of manufacturing a cathode for a plasma etching apparatus and a cathode manufactured thereby, wherein the inside of the holes formed on the cathode and the surface of the cathode are formed as a hard surface, thereby removing the protrusions which are the sources of particles, and preventing production flaws caused by particles while improving the reliability of the semiconductor devices.

To achieve these and other advantages and in accordance with the purpose of the present invention, the method of manufacturing a cathode of a plasma etching apparatus includes: a) forming a plurality of holes in a silicon substrate of the cathode for the plasma etching apparatus for inducing gas into the etching chamber therethrough; b) carrying out a physical-surface treatment on the surface of the silicon substrate using slurry; and c) carrying out a chemical-surface treatment for removing protrusions inside the holes formed on the silicon substrate and on the surface of the silicon substrate using potassium hydroxide (KOH).

The method further preferably includes a step of cleaning the silicon substrate between the steps of forming a plurality of holes and carrying out a physical-surface treatment, wherein the step of cleaning includes: cleaning by megasonic waves; cleaning by a chemical comprising HF, $HNO_3$ and deionized water with a certain ratio; and cleaning by deionized water, in order to remove damage to the silicon substrate caused during the step of forming the holes.

The method preferably further includes a step of cleaning the silicon substrate after the step of carrying out a chemical-surface treatment, wherein the step of cleaning includes: cleaning by a chemical comprising HF, $HNO_3$ and deionized water with a certain ratio; and cleaning by deionized water, respectively. Alternatively, the cleaning may include: cleaning by megasonic waves; cleaning by a chemical comprising HF, $HNO_3$ and deionized water with a certain ratio; and cleaning by deionized water, in order to remove any particles remaining on the silicon substrate.

Preferably, a step of drying the silicon substrate is further carried out after the step of cleaning, wherein the step of drying includes drying by isopropyl alcohol and drying by an oven.

The step of carrying out a physical-surface treatment can be carried out more than two times, and each of the physical-surface treatments therein is carried out using different kinds and different particle sizes of slurry.

Preferably, the slurry used for the physical-surface treatments includes: a SiC slurry with a particle size of 6.0 $\mu$m to 7.0 $\mu$m; an $Al_2O_3$ slurry with a particle size of 5.0 $\mu$m to 6.0 $\mu$m; and a silica slurry with a particle size less than 0.10 $\mu$m.

In addition, a step of cleaning is further carried out after each of the physical-surface treatments, wherein the step of cleaning includes: cleaning by megasonic waves; cleaning by a chemical comprising HF, $HNO_3$ and deionized water with a certain ratio; and cleaning by deionized water. Alternatively, the cleaning includes: cleaning by KOH; cleaning by a chemical comprising HF, $HNO_3$ and deionized water with a certain ratio; and cleaning by deionized water.

The KOH comprises 46 weight percent of KOH with the remaining percent being deionized water, the temperature of the KOH ranges from 85 to 95° C., and the step of cleaning is carried out preferably for 30 to 90 sec.

Preferably, the frequency of the megasonic waves used in the step of cleaning is 25 kHz, and the step of cleaning by the megasonic waves is carried out for 150 to 200 sec.

The ratio of the elements of the chemical comprising HF, $HNO_3$ and deionized water is preferably 0.1:5:1 to 5:45:55 (HF: $HNO_3$: deionized water).

The step of drying using isopropyl alcohol may be carried out at a temperature of 50 to 70° C. for 25 to 35 min., and the step of drying using an oven may be carried out at a temperature of 40 to 60° C. for 50 to 70 min.

In another aspect of the present invention, the method of manufacturing a cathode for a plasma etching apparatus includes: a) forming a plurality of holes in a silicon substrate of a cathode for a plasma etching apparatus for inducing gas into an etching chamber therethrough; b) carrying out a step of first-cleaning the silicon substrate using megasonic waves, a chemical comprising HF, $HNO_3$ and deionized water with a certain ratio, and deionized water, respectively and successively, in order to remove damage to the silicon substrate formed during the step of forming the holes; c) carrying out a physical-surface treatment for polishing the surface of the silicon substrate more than two times using slurry of various kinds and various particle sizes; d) carrying out a chemical-surface treatment for removing protrusions inside the holes formed on the silicon substrate and on the surface of the silicon substrate using KOH; e) carrying out a step of second-cleaning the silicon substrate using megasonic waves, a chemical comprising HF, $HNO_3$ and deionized water with a certain ratio, and deionized water, respectively and successively, in order to remove any particles remaining on the silicon substrate; and f) drying the silicon substrate using isopropyl alcohol and an oven.

In addition, a step of cleaning the silicon substrate is carried out after performing each physical-surface treatment, wherein the step of cleaning includes: cleaning by megasonic waves; cleaning by a chemical comprising HF, $HNO_3$ and deionized water with a certain ratio; and cleaning by deionized water. Alternatively, the cleaning includes: cleaning by KOH; cleaning by a chemical comprising HF, $HNO_3$ and deionized water with a certain ratio; and cleaning by deionized water.

A cathode for a plasma etching apparatus manufactured by the above method includes: a silicon substrate; and holes formed in the silicon substrate, wherein the surface thereof and the inside surface of the holes are formed as a hard surface free of protrusions using KOH.

It is understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

DETAILED DESCRIPTION OF PREFERRED EMBODIMENTS

Reference will now be made in detail to preferred embodiments of the present invention, examples of which are illustrated in the accompanying drawings.

The present invention provides a method of manufacturing a cathode for a plasma etching apparatus, comprising: formation of a plurality of holes on the a silicon substrate of the cathode; physical-surface treatment for the surface of the silicon substrate using slurry; and chemical-surface treatment for removing protrusions inside the holes formed on the silicon substrate and on the surface of the silicon substrate using potassium hydroxide (KOH).

Figure 1:
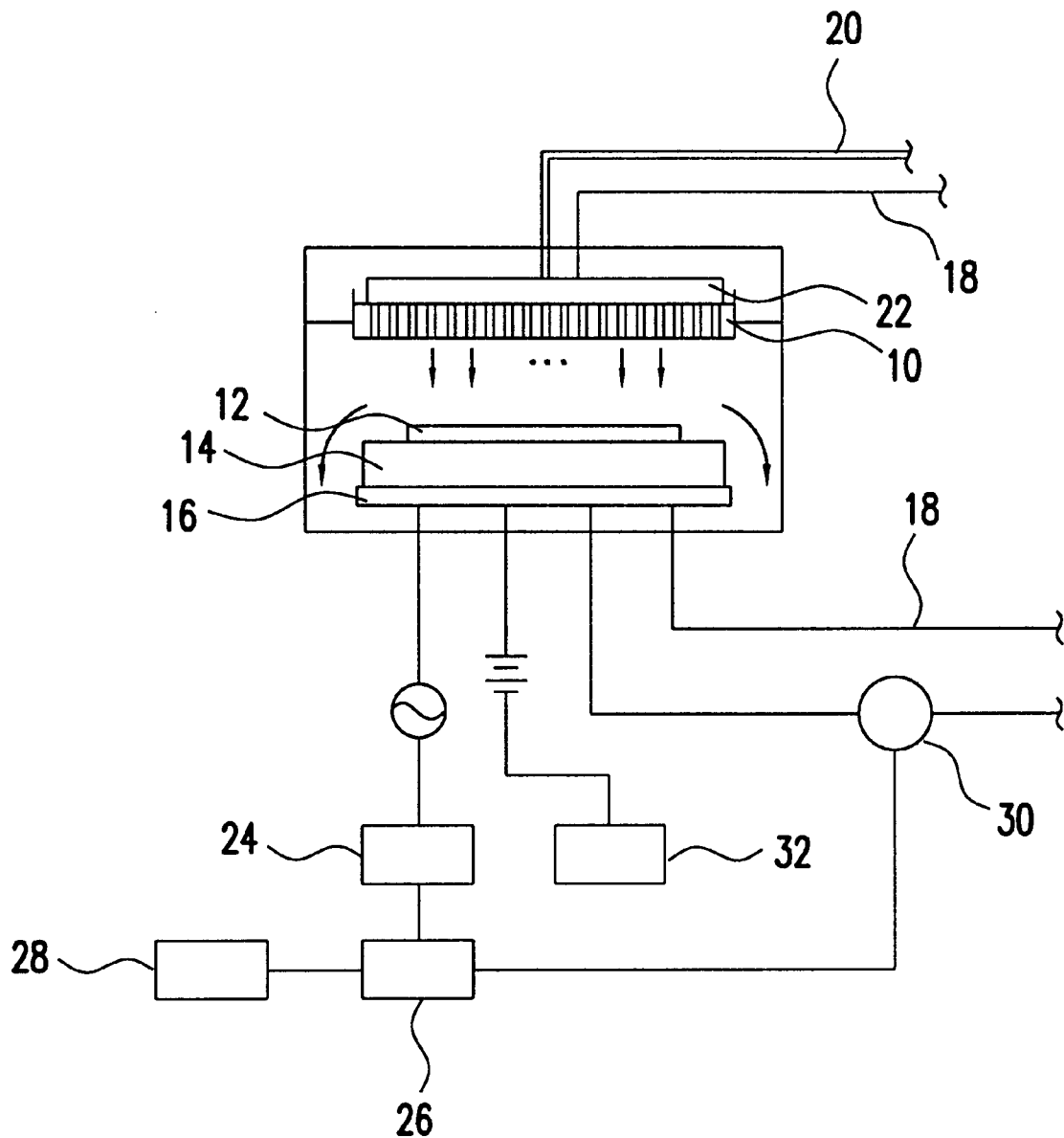
FIG. 1 is a schematic representation showing the conventional plasma etching apparatus.
Figure 2:
FIG. 2 is a photograph showing a magnified surface of the cathode of the conventional plasma etching apparatus.
Figure 3:
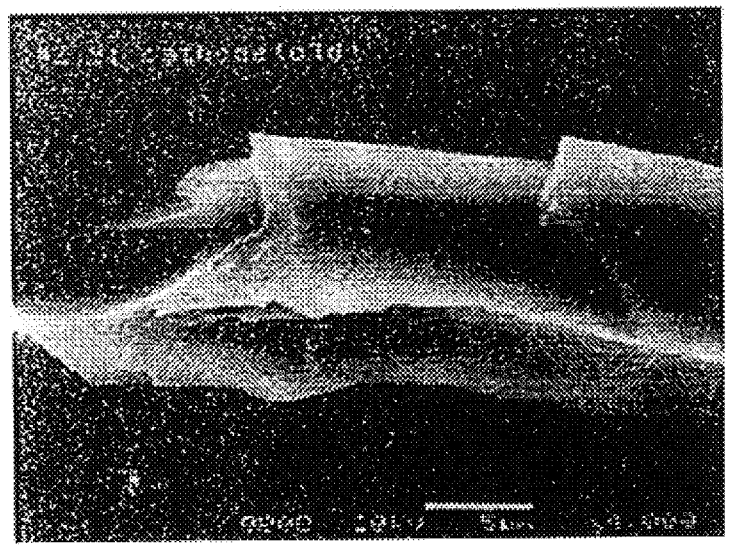
FIG. 3 is a photograph showing a magnified inside surface of the holes formed in the cathode of the conventional plasma etching apparatus.
Figure 4:
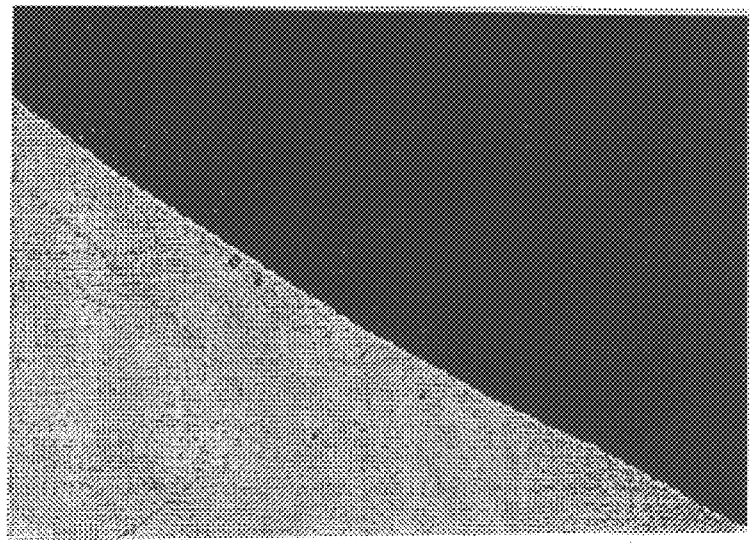
FIG. 4 is a photograph showing a magnified surface of the cathode of the conventional plasma etching apparatus after carrying out the etching process for 3,000 min. using the conventional plasma etching apparatus.
Figure 5:
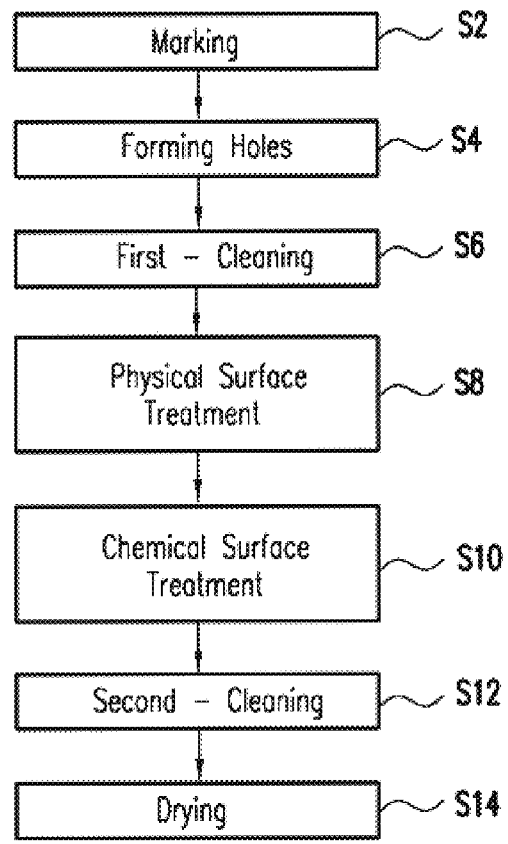
FIG. 5 is a process sequence of one embodiment of the method of manufacturing a cathode for the plasma etching apparatus according to the present invention.
Figure 6:
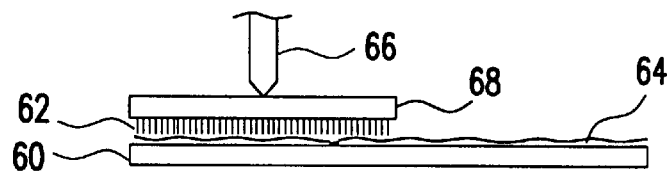
FIG. 6 shows a part of the apparatus for carrying out the step S4 according to the method of the present invention.

One embodiment of the method of the present invention is shown in the flow chart of FIG. 5. The first step (S2) is a marking step, in which a silicon substrate is marked with a fabrication number on one side using a diamond pencil. Then, at least 2,000 holes are formed in the silicon substrate (step S4). The holes are formed in one portion of the silicon substrate 60 at a time, as shown in FIG. 6, and that one portion is about one-fourth of the total surface area of the silicon substrate. The holes are formed by pins 62 fixed to a die 68 as described below.

Boron carbide slurry 64, having a particle size of about 23 $\mu$m, is supplied between the surface of the silicon substrate 60 and the pins 62, and at the same time, the die 68 is vibrated by means of a vibration generator 66 at a frequency of about 20 kHz. The pins 62 are positioned above the upper surface of the boron carbide slurry 64 at a height of about 2 $\mu$m. The boron carbide slurry 64 between the pins 62 and the silicon substrate 60 is thus vibrated, and the holes are formed in the silicon substrate 60 by the vibration.

After forming the holes (S4), a first-cleaning step is carried out in order to remove damage made on the silicon substrate 60 during the step of forming the holes. The first-cleaning step (S6) comprises three successive cleanings: by megasonic waves; by a chemical comprising HF, $HNO_3$ and deionized water with a certain ratio; and by deionized water.

Figure 7:
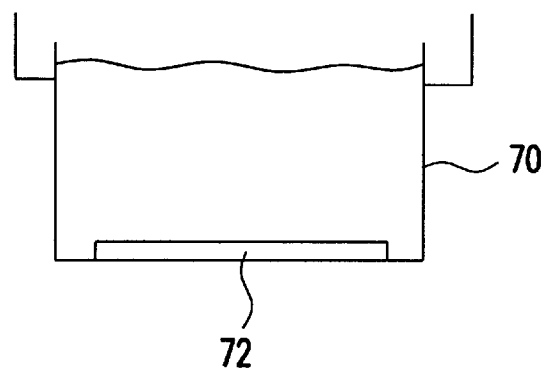
FIG. 7 shows a bath for carrying out the step S6 according to the method of the present invention.

The cleaning by megasonic waves uses a bath 70 as shown in FIG. 7 containing a chemical (tradename ET-2000) comprising water-soluble organic material, preferably alkaloid-containing organic material, and deionized water mixed at a ratio of about 1:20 at a temperature of about 60° C. This mixture can be vibrated at a frequency of about 25 kHz using a vibration generator 72 for about three minutes, preferably 150 to 200 sec.

The cleaning in the chemical solution comprising HF, $HNO_3$ and deionized water is preferably for about one hour. The mixing ratio of HF: $HNO_3$: deionized water is preferably 0.1:5:1 to 5:45:55, wherein the ratio is selected so as to protect any native oxide film or heavy metal material which has been grown on the silicon substrate to facilitate its use as a cathode. If the HF and $HNO_3$ are used at more than 5% concentration, the surface state of the silicon substrate can be affected thereby.

Then, the cleaning in deionized water is preferably for about 15 minutes. A series of bathes (not shown) can be prepared for containing each of the chemicals and the deionized water, respectively, so as to carry out the steps successively.

Next, a physical-surface treatment step (S8) polishes the surface of the silicon substrate using slurry. The physical-surface treatment can be carried out more than two times using slurry of varying kinds and various particle sizes.

Preferably, the physical-surface treatment (S8) comprises a polishing by a SiC-containing slurry having a particle size of 6.0 to 7.0 $\mu$m, preferably tradename GC 2000 having a particle size of about 6.7 $\mu$m, mixed with deionized water with a ratio of 6:1 and supplied to the silicon substrate at a supply rate of about 0.18 l/min. for about 25 to 30 minutes on each surface of the silicon substrate. In other words, the above polishing is carried out on both surfaces of the silicon substrate and the above time is for polishing a single surface. Next, a polishing may be carried out sing an $Al_2O_3$-containing slurry having a particle size of 5.0 to 6.0 $\mu$m, preferably tradename FO 1500 having a particle size of 5.5 $\mu$m, used under the same conditions as the SiC-containing slurry. Then a polishing may be carried out using a silica-containing slurry having a particle size less than 0.10 $\mu$m, preferably 0.05 $\mu$m, including deionized water mixed with a ratio of about 1:1 at a supply rate of about 0.18 l/min. for about 60 minutes. The polishing operations are carried out successively.

After each of the polishing operations in the physical-surface treatment, a cleaning operation may be carried out, with the cleaning operation comprising cleaning by megasonic waves, cleaning by a chemical comprising HF, $HNO_3$ and deionized water with a certain ratio, and cleaning by deionized water, successively.

Then, the silicon substrate undergoes a chemical surface treatment step (S10) comprising a cleaning by KOH, followed by a second-cleaning step (S12) comprising a cleaning by HF, $HNO_3$ and deionized water mixed at a certain ratio, and a cleaning by deionized water, carried out successively. The second-cleaning step (S12) uses bathes (not shown) to contain each of the chemicals and the deionized water respectively.

The chemical-surface treatment step (S10) is carried out in order to remove the protrusions existing inside the holes formed on the surface of the silicon substrate, and on the surface thereof, using KOH comprising 46 weight percent of KOH and the remaining percent of deionized water at a temperature of 85 to 95° C. for 30 to 90 sec., more preferably at a temperature of about 91° C. for about one minute.

In this step of using KOH at a temperature of 85° C., the etch rate of the silicon is about 1.4 $\mu$m/min. The etch rate of the silicon oxide film is about 30 Å/min., wherein the chemical reaction formula can be shown as follows,

$$Si + K^+ + 2OH^- + 2H_2O = SiO_2(OH)_2^{2-} + 2H_2 + K^+$$

Figure 8:
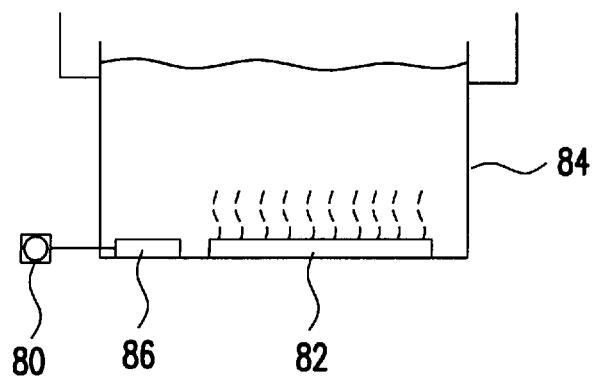
FIG. 8 shows a bath for carrying out the step S10 according to the method of the present invention.

As shown in FIG. 8, the step of using KOH can be carried out using a bath 84 including a temperature controller 80 for controlling the temperature of the KOH, and a bubbler 82 for supplying $N_2$ gas during the process. That is, the temperature controller 80 controls the temperature of the KOH contained in the bath 84 by applying power to a nichrome line connected to the temperature controller 80 and placed in a quartz tube 86 provided on the bottom of the bath 84.

In addition, the bubbler 82 is provided on the bottom of the bath 84 for supplying $N_2$ gas upwardly, wherein the $N_2$ gas bubbles in order to remove the $H_2$ gas generated by the chemical reaction shown above, in order to prevent chemical-surface treatment other than the desired KOH etching of the silicon or silicon oxide film.

The second-cleaning step (S12) uses a chemical comprising HF, $HNO_3$ and deionized water with a certain ratio, and then deionized water, successively. Alternatively, the second-cleaning step (S12) may include a cleaning using megasonic waves, followed by a cleaning using a chemical comprising HF, $HNO_3$ and deionized water with a certain ratio, and then the cleaning using deionized water, successively. In either case, the second-cleaning step (S12) removes any particles remaining on the silicon substrate. The cleaning using megasonic waves can be included or skipped at the discretion of the operator, otherwise the second-cleaning step (S12) is carried out in the same manner as the first-cleaning step S6, such that the ratio of the elements of the chemical is the same as in step S6. However, the duration of the cleanings in step S12 is different from those of step S6. In particular, the cleaning in HF, $HNO_3$ and deionized water is for about one minute, and the cleaning using deionized water is for about 30 minutes.

In a second embodiment of the present method, the second-cleaning step (S12) is followed by a further physical surface treatment step (S8) in which the silicon substrate is polished using a silica-containing slurry of a size less than 0.10 $\mu$m, preferably about 0.05 $\mu$m mixed with deionized water with a ratio of about 1:1, supplied to the silicon substrate at a rate of about 0.18 l/min for about 60 minutes. This polishing is followed by a cleaning using megasonic waves, then the chemical comprising HF, $HNO_3$ and deionized water for about one minute, and then deionized water for about 15 minutes.

In addition, this polishing and cleaning is followed by steps S10 and S12, specifically, the chemical surface treatment in KOH for about one minute, and then the second-cleaning in the chemical comprising HF, $HNO_3$ and deionized water for about one minute, and in deionized water alone for about 15 minutes.

In a third embodiment of the present method, one final polishing and cleaning may also be carried out, using the silica-containing slurry for about 40 minutes, followed by the chemical surface treatment (step S10) in KOH for about one minute, and the second-cleaning (step S12) in HF, $HNO_3$ and deionized water for about one minute, and in deionized water alone for about 15 minutes. Finally, the second-cleaning (step S12) is repeated using megasonic waves for about 3 minutes, and then HF, $HNO_3$ and deionized water for about two minutes and then deionized water for about 45 minutes.

The final step of the present method is a drying step (S14), for drying the silicon substrate using isopropyl alcohol and an oven. The drying using isopropyl alcohol can be carried out at a temperature of 50 to 70° C. for about 25 to 35 min., preferably 60° C. for about 30 minutes; and the drying using an oven can be carried out at a temperature of 40 to 60° C. for about 50 to 70 min., preferably 50° C. for about 60 minutes.

Figure 9:
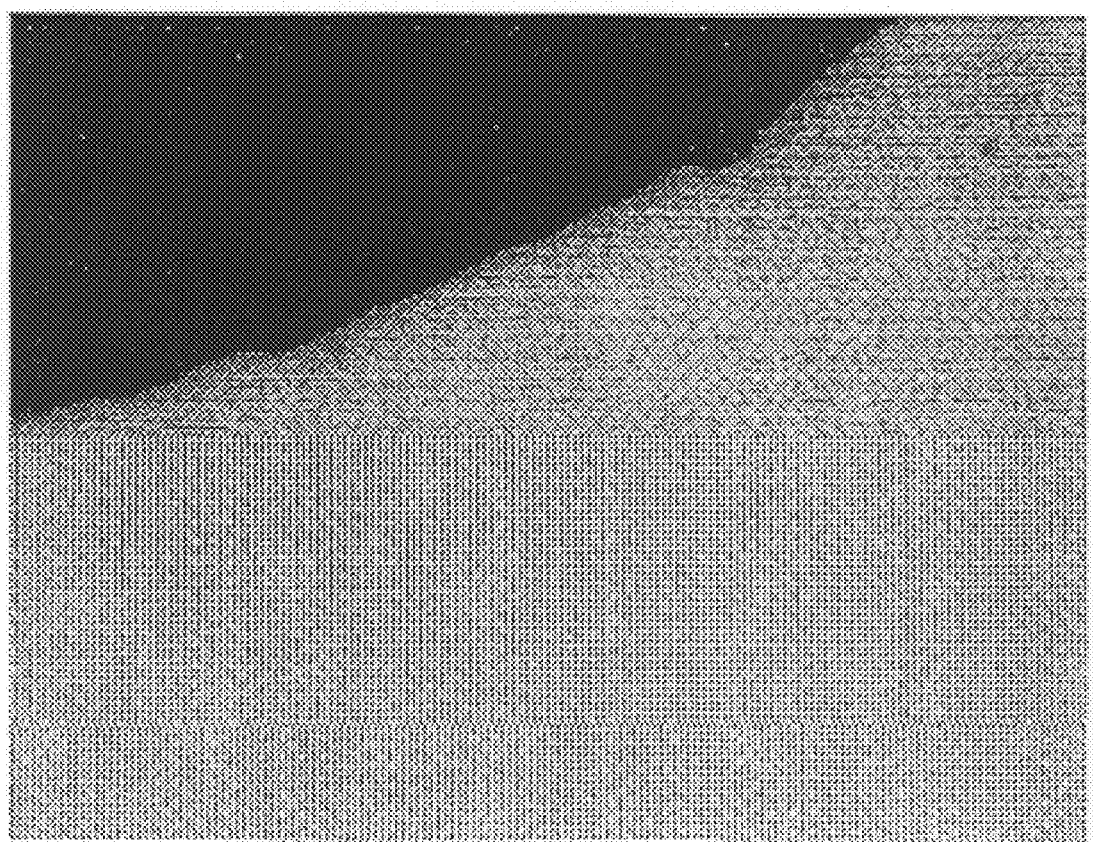
FIG. 9 is a photograph showing a magnified surface of the cathode of the plasma etching apparatus manufactured according to the method of the present invention.

Accordingly, the protrusions on the surface of the silicon substrate of the cathode and inside the holes formed thereon can be removed. In other words, as shown in the FIG. 9 photograph, which depicts the silicon substrate magnified 400 times, the surface of the silicon substrate and the inside of the holes can be made as a slippery, hard surface during the initial fabrication of the cathode.

Therefore, according to the present invention, since the inside of the holes formed on the silicon substrate and the surface thereof can be made as a hard surface during the initial fabrication of the cathode, the particle source can be removed before the cathode is used in an etching process. Thus, use of the cathode of the present invention minimizes production failure during the etching process caused by particles generated by the cathode. The cathode of the present invention can also be used for etching an oxide film, polysilicon film, or metal film, etc.

In addition, because the surface of the silicon substrate from which the cathode is made is treated into a hard surface, no protrusions are present on the silicon substrate to be etched and removed while the cathode is in use during an etching process. Therefore, particle generation is minimized and the life time of the cathode is improved.

Moreover, according to the present invention, by forming the surface of the silicon substrate and the inside of the holes into a hard surface, the source of particle generation is eliminated, so as to minimize production failures and improve production reliability.

While the present invention has been described in detail, it should be understood that various changes, substitutions and alterations can be made hereto without departing from the spirit and scope of the invention as defined by the appended claims.

What is claimed is:

1. A method of manufacturing a cathode for a plasma etching apparatus, comprising steps of:

a) forming a plurality of holes in a silicon substrate of the cathode;

b) carrying out a physical-surface treatment on a surface of the silicon substrate using slurry; and c) carrying out a chemical-surface treatment for removing protrusions inside the holes formed in the silicon substrate and on the surface of the silicon substrate using potassium hydroxide (KOH).

2. The method of manufacturing a cathode for a plasma etching apparatus as claimed in claim 1, further comprising a step of cleaning the silicon substrate between the steps of forming a plurality of holes and carrying out a physical-surface treatment, wherein the step of cleaning comprises:

cleaning by megasonic waves;

cleaning by a chemical comprising HF, $HNO_3$ and deionized water with a certain ratio; and cleaning by deionized water.

3. The method of manufacturing a cathode for a plasma etching apparatus as claimed in claim 2, wherein a frequency of the megasonic waves is 25 kHz, and the step of cleaning by the megasonic waves is carried out for 150 to 200 sec.

4. The method of manufacturing a cathode for a plasma etching apparatus as claimed in claim 2, wherein the ratio of elements of the chemical comprising HF, $HNO_3$ and deionized water is 0.1:5:1 to 5:45:55 (HF:$HNO_3$:deionized water).

5. The method of manufacturing a cathode for a plasma etching apparatus as claimed in claim 1, further comprising a step of cleaning the silicon substrate after the step of carrying out the chemical-surface treatment, wherein the step of cleaning comprises:

cleaning by a chemical comprising HF, $HNO_3$ and deionized water with a certain ratio; and cleaning by deionized water.

6. The method of manufacturing a cathode for a plasma etching apparatus as claimed in claim 3, further comprising a step of drying the silicon substrate after the step of cleaning, wherein the step of drying comprises a drying by isopropyl alcohol and a drying by an oven.

7. The method of manufacturing a cathode for a plasma etching apparatus as claimed in claim 5, wherein the step of drying using isopropyl alcohol is carried out at a temperature of 50 to 70° C. for 25 to 35 min., and the step of drying using an oven is carried out at a temperature of 40 to 60° C. for 50 to 70 min.

8. The method of manufacturing a cathode for a plasma etching apparatus as claimed in claim 1, further comprising a step of cleaning the silicon substrate after the step of carrying out the chemical-surface treatment, wherein the step of cleaning comprises:

cleaning by megasonic waves;

cleaning by a chemical comprising HF, $HNO_3$ and deionized water with a certain ratio; and cleaning by deionized water.

9. The method of manufacturing a cathode for a plasma etching apparatus as claimed in claim 1, wherein the step of carrying out a physical-surface treatment is carried out more than two times, and each physical-surface treatment uses a different kind and different particle size of slurry.

10. The method of manufacturing a cathode for a plasma etching apparatus as claimed in claim 6, wherein the kinds and particle sizes of slurry comprise: SiC slurry with a particle size of 6.0 μm to 7.0 μm; $Al_2O_3$ slurry with a particle size of 5.0 μm to 6.0 μm; and silica slurry with a particle size less than 0.10 μm.

11. The method of manufacturing a cathode for a plasma etching apparatus as claimed in claim 6, further comprising a step of cleaning after each of the physical-surface treatments, wherein the step of cleaning comprises:

cleaning by megasonic waves;

cleaning by a chemical comprising HF, $HNO_3$ and deionized water with a certain ratio; and cleaning by deionized water.

12. The method of manufacturing a cathode for a plasma etching apparatus as claimed in claim 6, further comprising a step of cleaning after each of the physical-surface treatments, wherein the step of cleaning comprises:

cleaning by potassium hydroxide (KOH);

cleaning by a chemical comprising HF, $HNO_3$ and deionized water with a certain ratio; and cleaning by deionized water.

13. The method of manufacturing a cathode for a plasma etching apparatus as claimed in claim 1, wherein the KOH comprises 46 weight percent of KOH and remaining percent being deionized water.

14. The method of manufacturing a cathode for a plasma etching apparatus as claimed in claim 1, wherein a temperature of the KOH ranges from 85 to 95° C., and the chemical surface treatment is carried out for 30 to 90 sec.

15. A method of manufacturing a cathode for a plasma etching apparatus comprising steps of:

a) forming a plurality of holes in a silicon substrate of the cathode;

b) carrying out a step of first-cleaning the silicon substrate using megasonic waves, a chemical comprising HF, $HNO_3$ and deionized water with a certain ratio, and deionized water, respectively and successively;

c) carrying out a physical-surface treatment on a surface of the silicon substrate more than two times using slurry of various kinds and particle sizes;

d) carrying out a chemical-surface treatment for removing protrusions inside the holes formed on the silicon substrate and on the surface of the silicon substrate using potassium hydroxide (KOH);

e) carrying out a step of second-cleaning the silicon substrate using megasonic waves, a chemical comprising HF, $HNO_3$ and deionized water with a certain ratio, and deionized water, respectively and successively, in order to remove particles remaining on the silicon substrate; and f) drying the silicon substrate using isopropyl alcohol and an oven, successively.

16. The method of manufacturing a cathode for a plasma etching apparatus as claimed in claim 15, further comprising a step of cleaning the silicon substrate after carrying out each physical-surface treatment, wherein the step of cleaning comprises:

cleaning by megasonic waves;

cleaning by a chemical comprising HF, $HNO_3$ and deionized water with a certain ratio; and cleaning by deionized water.

17. The method of manufacturing a cathode for a plasma etching apparatus as claimed in claim 15, further comprising a step of cleaning the silicon substrate after carrying out each physical-surface treatment, wherein the step of cleaning comprises:

cleaning by KOH;

cleaning by a chemical comprising HF, $HNO_3$ and deionized water with a certain ratio; and cleaning by deionized water.

18. A cathode for a plasma etching apparatus, comprising:

a silicon substrate; and holes formed in the silicon substrate, wherein a surface of the silicon substrate has been physically treated using slurry and wherein the surface of the silicon substrate and an inside surface of the holes in the silicon substrate are formed as a hard surface free of protrusions using potassium Hydroxide (KOH).

* * * * *